(12) United States Patent
Morita et al.

(10) Patent No.: US 8,592,996 B2
(45) Date of Patent: Nov. 26, 2013

(54) SEMICONDUCTOR DEVICE AND METHOD OF MANUFACTURING THE SAME

(75) Inventors: Toshiaki Morita, Hitachi (JP); Yusuke Yasuda, Hitachi (JP); Eiichi Ide, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 132 days.

(21) Appl. No.: 12/825,783

(22) Filed: Jun. 29, 2010

(65) Prior Publication Data

US 2011/0012262 A1     Jan. 20, 2011

(30) Foreign Application Priority Data

Jun. 30, 2009    (JP) ................................ 2009-154522

(51) Int. Cl.
*H01L 23/48*          (2006.01)

(52) U.S. Cl.
USPC ............................ 257/782; 257/762; 257/783

(58) Field of Classification Search
USPC ......................................... 257/762, 782, 783
See application file for complete search history.

(56) References Cited

U.S. PATENT DOCUMENTS 7,042,010 B2 *   5/2006   Sinha ............................... 257/71
7,432,580 B2 *   10/2008   Sato et al. ...................... 257/516
2003/0020159 A1 *   1/2003   Schwarzbauer ............... 257/705
2004/0140547 A1 *   7/2004   Yamazaki et al. ............. 257/686
2004/0245648 A1   12/2004   Nagasawa et al.
2004/0253803 A1 *   12/2004   Tomono et al. ................ 438/614
2006/0038304 A1 *   2/2006   Osako et al. ................... 257/789
2006/0199360 A1 *   9/2006   Alford et al. .................. 438/597
2007/0090497 A1 *   4/2007   Abbott .......................... 257/666
2008/0160183 A1 *   7/2008   Ide et al. ..................... 427/126.5
2009/0244868 A1   10/2009   Morita et al.
2013/0071971 A1 *   3/2013   Kajiwara et al. .............. 438/123

FOREIGN PATENT DOCUMENTS

| JP | 62-155529 | * 7/1987 |
|---|---|---|
| JP | 2004-107728 | 4/2004 |
| JP | 2008-178911 | 8/2008 |
| JP | 2009-154522 | 11/2012 |

* cited by examiner

*Primary Examiner* — David Vu
*Assistant Examiner* — Brandon Fox
(74) *Attorney, Agent, or Firm* — Antonelli, Terry, Stout & Kraus, LLP.

(57) ABSTRACT

A semiconductor device wherein a semiconductor element made of Si or Si group material mounted on a substrate, the semiconductor element is mounted on the substrate and the semiconductor element is bonded to a silver bonding material via a oxide film formed on the semiconductor element. The bonding material comprising silver oxide particles having an average particle size of 1 nm to 50 nm and an organic reducing agent is used for bonding in air, which gives a high bonding strength to the oxide on the semiconductor element.

19 Claims, 3 Drawing Sheets

SINTERED STRUCTURE OF
SINTERING SILVER PASTE

SINTERED STRUCTURE OF
SILVER OXIDE PASTE

SEMICONDUCTOR DEVICE AND METHOD OF MANUFACTURING THE SAME

CLAIM OF PRIORITY

This application claims priority from the Japanese Patent Application Serial No. 2009-154522, filed on Jun. 30, 2009, the content of which is hereby incorporated by reference into this application.

FIELD OF TECHNOLOGY

The present invention relates to a semiconductor device using a bonding material containing fine silver compound particles as a main ingredient, and a method of manufacturing the semiconductor device.

BACKGROUND ART

In bonding electronic devices, lead-free solders have been wanted, but as to high temperature solders, there have been no substitute materials so far. In encapsulating semiconductor devices, it is necessary to use hierarchical solders, and substitute for the high temperature solder materials have been demanded.

If a particle size of metal particles for substitutes of the high temperature solders becomes 100 nm or less, wherein the number of atoms is small, a specific surface area of the particle per a volume of the particles drastically increases, and it has been known that a melting point and a sintering temperature thereof will remarkably lower, compared to those of bulk materials.

By virtue of this low temperature sintering effect, a bonding material using metal particles having a particle size of 1 to 100 nm has been studied. See for example patent document No. 1: Japanese patent laid-open 2004-107728 (US 2004/024564). The patent document No. 1 discloses a bonding material wherein nuclei of metal particles having an average particle size of 100 nm or less are covered with an organic coating and the coated particles are dispersed in a liquid, and the bonding is carried out by sintering the metal particles by heating. Since in this bonding method the metal particles after bonding change into bulk metal and metallic bonding is effected at interfaces between the metal particles, the bonding gives high heat resistance and reliability and high heat dissipation efficiency. In the patent document No. 1, the above bonding materials are referred to as a substitute for the high temperature solders that do not contain lead.

However, if the paste of the sintering type, which contains the metal particles having the average particle size of 100 nm or less as a main ingredient for the bonding material is used, it has been elucidated that while a sufficient bonding strength is obtained in cases of noble metals such as Au, Ag, Pd etc, it is impossible to bond semiconductors made of Si or SiC, which have oxide films on faces for bonding. FIG. 6 shows evaluation results of bonding strengths with respect to various bonding members. A bonding temperature was 300° C. and a bonding pressure was 1.0 MPa constant, a bonding material silver particles having an average particle size of 10 nm, coated with an amine series organic material. A bonding atmosphere was air. Bonding members to be bonded were Au, Ag, Si and SiC.

The vertical line in FIG. 6 indicates a shearing strength at the bonded face, wherein a shearing strength of silver metal is one and the shear strengths at the bonding faces were a ratio to that of the silver metal. As is apparent from the results, in case of bonding in air, the sintering type bonding materials show good bonding characteristics with respect to such metals as Au, Ag, etc that are hard to be oxidized, but they do not show any bondability to Si and SiC at all. This is because an oxidation film exists on a bonding face (rear side face) of Si series semiconductor elements, and hence the oxidation film does not show the bonding characteristics at the time of sintering of the metal particles. Therefore, it has been common to form a metalized film on the rear side face of the semiconductor elements so that the bonding is effected between the semiconductor elements and supporting substrates by means of the metalized film.

Alcohol series organic materials for covering the ultra fine particles disclosed in patent document No. 1 vanish only by heating in air, which are useful for not oxidizable noble metals, but may not be useful for Si series materials having an oxide film on its surface.

In the patent document No. 1, the ultra fine metal particles are used as a starting material in a form of metal salts such as organic acid salts of metals, wherein the metal salts and organic materials such as alcohol are dispersed in an organic solvent to form a paste, and the mixture is heated to thereby form the ultra fine metal particles resulting in composite metal particles, which combine with the organic materials.

Patent document No. 2 (Japanese patent laid-open 2008-178911) discloses a bonding material comprising particles of a metal oxide, metal carbonate salt or metal carboxylic salt having an average particle size of 1 to 50 nm, and an organic reducing agent, the particles being mixed with the reducing agent, but the patent document does not disclose bonding of a substrate and a semiconductor element via an oxide film.

Although US 2009/0244868, which is not a prior art and published after the present patent application in Japan discloses a bonding structure wherein an aluminum electrode and of a semiconductor and a silver bonding layer are bonded via an amorphous layer (aluminum oxide film). The bonding layer, which comprises particles of a metal oxide, a metal acetate or a metal formic acid compound having a particle size of 1 to 50 nm and an organic reducing agent, is prepared by heating the bonding material, but it does not disclose a structure wherein a semiconductor element and a supporting substrate are bonded via a Si oxide film present in a rear face of the Si type semiconductor element.

SUMMARY OF THE INVENTION

It is an object of the present invention to provide a semiconductor device having a bonding portion with a strong bonding strength between a semiconductor element and a supporting substrate and a high thermal conductivity. It is another object of the present invention to provide a method of manufacturing a semiconductor device having such the bonding portion. It is still another object of the present invention to provide a semiconductor device in which a semiconductor element and a supporting substrate can be bonded without forming a metallized layer on the semiconductor element.

According to the present invention, it is possible to provide a semiconductor device comprising a Si group semiconductor element and a supporting substrate having a metal face on which the semiconductor element is mounted, wherein the semiconductor element has a circuit on its main surface, and a rear face thereof is bonded with a metal face of a supporting substrate via an oxide film of the semiconductor and a silver bonding layer, the oxide film being formed between the rear face of the semiconductor and the silver bonding layer, and wherein the silver bonding layer consists essentially of silver or a silver alloy, the crystal grains of the silver bonding layer contact closely each other, whereby the silver bonding layer and the oxide film, and the silver bonding layer and the metal face are closely contacted, respectively.

Further, the present invention provide a method of manufacturing a semiconductor device comprising a step for supporting a bonding material composed of particles of silver oxide, silver carbonate or silver carboxylate and an organic reducing agent between a rear face of a silicon group semiconductor element having a circuit in its main face and a metal face of a supporting substrate, a step for bonding the silicon group semiconductor element to the supporting substrate via an oxide film whose main component is silicon oxide formed on the rear face of the silicon group semiconductor element by forming a bonding layer consisting essentially of a sintered silver metal, which is prepared by metallizing the silver compound by heating the bonding material, the silicon group semiconductor element and the supporting substrate in an oxidative atmosphere.

Figure 1:
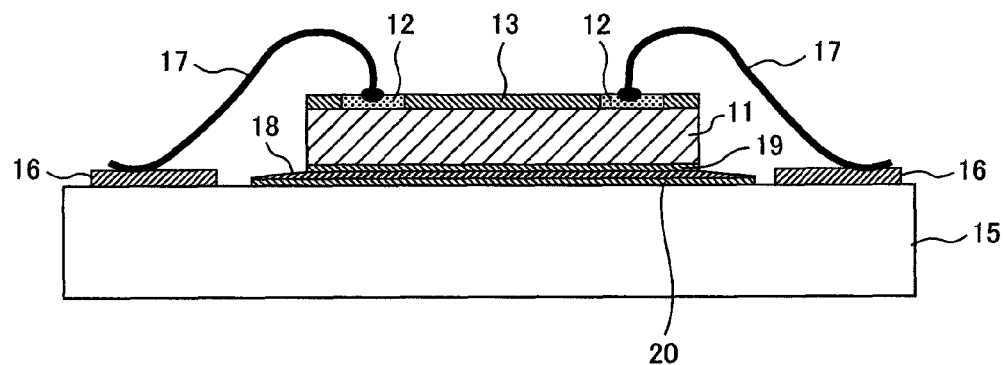
FIG. 1 is an enlarged cross sectional view of a semiconductor element mounting portion of a semiconductor device according to an embodiment of the present invention.

REFERENCE NUMERALS 11, 101; semiconductor element, 12, 106, 107; electrode pads, 13; protecting film, 15, 120; mounting substrate for semiconductor parts, 16; connecting wire, 17; gold wire, 18; silver bonding material, 100; encapsulating resin, 102; bonding wire, 103; wiring substrate, 104; electrode, 105; solder ball, 108; silver bonding material containing silver oxide as a precursor, 121; wiring, 122; electrode, 123; an area for mounting semiconductor element

DETAILED DESCRIPTION OF PREFERRED EMBODIMENTS

Figure 6:
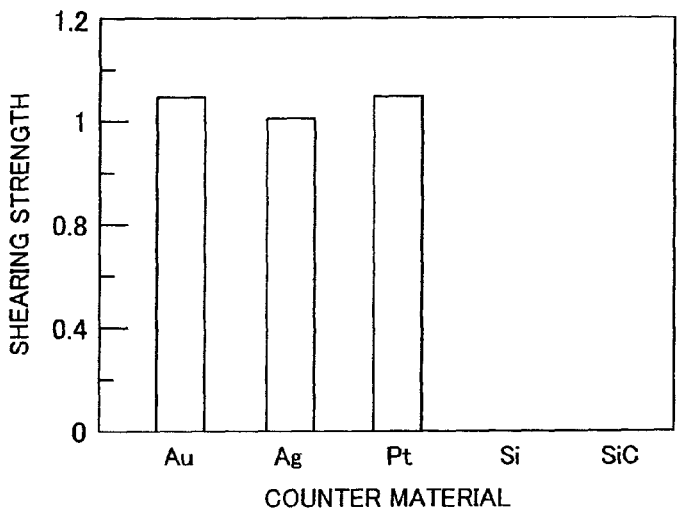
FIG. 6 shows evaluation results of bonding strength according to a conventional method.

In mounting semiconductor elements made of Si or SiC on a ceramic supporting substrate or a metal substrate having an insulating layer, there is an oxide film of $SiO_2$ film formed by native oxidation of the silicon group semiconductor element on its rear face (the face on which a circuit is not formed). A sufficient bonding strength between the $SiO_2$ oxide film and a silver bonding material is needed. As shown in FIG. 6, a bonding material disclosed in patent document No. 1 does not have bondability to a semiconductor element made of Si group material such as Si or SiC. However, the bonding material of the present invention was found to have a strong bondability to silver oxide formed on a face, to be bonded, of Si group semiconductor element.

A typical status of the bonding material of the present invention is a paste containing particles of silver oxide, silver carbonate or silver carboxylate, an organic solvent for dispersing the particles and the reducing agent. The silver oxide is silver alone, a silver alloy containing a metal other than silver by 10% by weight or less or a mixture of silver and another metal powder such as copper. In considering thermal conductivity of the bonded portion, it is preferable that a content of silver should be as high as possible, more preferably 90% by weight or more.

When the bonding material is heated to 200 to 400° C., reducing reaction takes place to change the silver carbonate, carboxylate to silver oxide. Since the reducing reaction is exothermic reaction, a further temperature elevation in the bonding layer takes place to accelerate sintering of the silver particles. As a result, the silver bonding layer strongly bonds to the metallized layer.

In the following explanation, though silver oxide is explained as a typical example, carboxylates of silver such as silver carbonate, silver acetate, silver formate, s patent documents Nos. 1 and 2 disclose that the above compounds, which are reduced to metal silver in the presence of a reducing agent can be used. However, silver oxide is the most preferred bonding material because it does not form carboxlic acid during the reducing reaction at all.

Organic reducing agents are at least one of alcohols, carboxylic acids and amines, and aldehydes, esters and ketones are also useful.

The semiconductor device according to the present invention has a structure of Si group semiconductor element-oxide film-silver bonding layer-metallized layer-supporting substrate, wherein the most important feature is that the semiconductor element and the bonding layer are bonded via the oxide film. That is, since Si oxide film present in the rear face of the semiconductor element can be bonded to the bonding layer as it is, a structure is simple and production cost may be reduced. A thickness of the oxide film is preferably 0.1 to 100 nm, more preferably 1 to 30 nm. The oxide film should be as thin as possible because heat from the semiconductor element transfers to the supporting substrate.

When the bonding layer is heated at 250 to 400° C., the silver oxide metallizes by the action of the reducing agent and a temperature in the paste elevates several hundreds by virtue of the reducing reaction to accelerate sintering of silver particles. This inner heat generation increases the bondability of the bonding layer and the oxide film. This phenomenon differs from the case where silver particles are sintered at around 400° C. to get a porosity of about 40%, According to this phenomenon, thermal conductivity of the bonding material becomes 50 to 430 W/mK, which is higher by several hundreds W/mK than that of the bonding material obtained by sintering silver particles. This thermal conductivity is higher by at least 20 W/mK than that of the sintering type bonding silver material. In addition, a content of silver or silver alloy in the bonding material obtained by reducing silver oxide is at least 99% wherein amounts of voids, organic substances or oxides are very small. This contributes to high thermal conductivity of the bonding layer.

Figure 7:
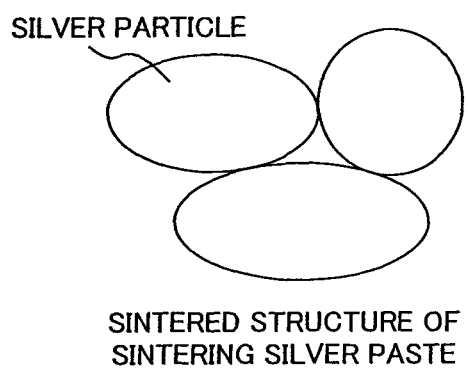
FIG. 7 shows a schematic view of a sintered type bonding layer utilizing silver metal particles.
Figure 8:
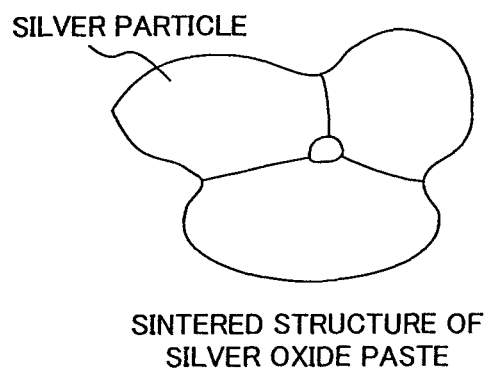
FIG. 8 shows a schematic view of a silver bonding layer according to an embodiment of the present invention.

FIG. 7 is a schematic view of the sintering type bonding layer using silver particles wherein sintered silver particles maintain shapes before sintering and contacts between silver particles are almost point contacts or line contacts. The silver particles prepared by mechanical grinding have more complicated shapes than shown in figure. On the other hand, the shape of the silver particles partially fuse and bond to form face contact with other silver particles as shown in FIG. 8. From this phenomenon, the silver bonding layer of the present invention has such characteristics that it has low porosity, high density and mechanical strength (bonding strength).

An average particle size of silver or silver alloy crystal after sintering is 10 to 50 nm. In case of the conventional technique using silver particles, an average particle size of silver is 3 μm or more. The reason for this is the minimum particle size of silver particles prepared by mechanical grinding is 1 μm. Further, when silver particles are used, silver particles are present as they are, the particles being in point contact or line contact. Therefore, thermal conductivity of the bonding layer does not increase. On the other hand, when silver oxide is reduced, it is thought that silver particles fuse and bond in sintering to make face contacts thereby to increase thermal conductivity of the bonding layer.

In bonding a semiconductor element to a supporting substrate, it is preferable to form a metalized layer in the bonding portion between a bonding layer and the supporting substrate. The metalized layer is selected from materials, which have good wettability with silver, such as gold, silver, copper. Form the economical point of view, nickel or chromium may be used.

In the following, embodiments of the present invention will be explained in detail. In the case where a bonding material that uses metal particles have a particle size of 100 nm or less as a main bonding material in a conventional method, it was revealed that a semiconductor element made of Si or SiC cannot be bonded without a metalized layer. On the other hand, as a result of detailed investigations by the present inventors, when a bonding is carried out using a specific bonding material in air atmosphere, it was found that a good bonding strength with respect to a semiconductor element made of Si or SiC having no metalized layer was obtained. That is, when the material comprising silver compound particles as silver particle precursor having an average particle size of 1 nm to 50nm and a organic reducing agent is used, bonding of a semiconductor element made of Si or SiC having no metallized layer at a bonding face, which is carried out in an air atmosphere, gives excellent bonding strength. In the specification, the precursor of the silver particles means silver oxide, and a precursor of the silver oxide means silver compounds such as silver carbonate or silver carboxylate.

In the bonding method of the present invention, when the organic reducing agent is added to the silver oxide or its precursor (silver carboxylate or silver carbonate), such a phenomenon occurs wherein the silver precursor becomes silver particles at a temperature lower than a decomposition of the precursor or silver oxide containing no reducing agent to reduce silver oxide, which forms silver particle having an average particle size of 100 nm or less and silver particles fuse and bond to bond each other.

Figure 5:
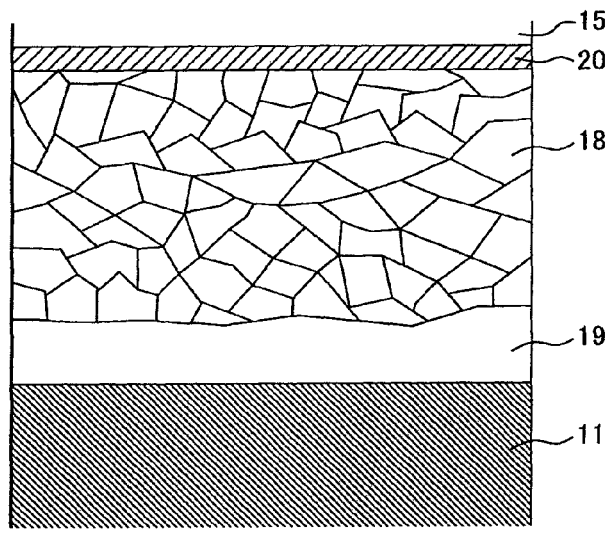
FIG. 5 shows a bonding status of the bonding portion of the present invention.

As shown in FIGS. 5 and 6, there is shown a difference between the present invention and the conventional method. In case of the conventional sintered type silver bonding material (using metallic silver particles), almost all of the silver particles in a resulting sintered body bond in the form of starting material. Since the silver particles contact at points or at lines, there are a lot of voids and thermal conductivity of the silver bonding layer is low. However, as shown in FIG. 6, a bonding layer formed by reducing silver oxide at a sintering temperature in the presence of the organic reducing agent, the silver particles fuse and adhere to increase contact face area by virtue of temperature elevation due to reducing reaction so that voids can be reduced by 10% or more and thermal conductivity increases.

Since the silver oxide particles having a particle size of 100 nm or less are formed at 200° C. or lower in the presence of the reducing agent, it is possible to carry out bonding at a temperature of 200° C. or lower at which the conventional process cannot be carried out. Further, since silver particles having a particle size of 100 nm or less are formed during the bonding, it is not necessary to prepare silver particles covered with a protecting organic material.

As a result, manufacturing of bonding materials and bonding process will be simplified and a cost of the bonding material will be reduced.

Further, since the surface of the oxide layer formed on the surface of the semiconductor element of Si or SiC becomes active due to reducing reaction heat of the reducing agent, the activated oxide film and the silver particles formed from the silver oxide particles are strongly bonded.

Silver oxide particles having a particle size of 1 nm to 50 μm are most suitable as the silver particle precursor for producing silver particles having a particle size of 100 nm or less because silver oxide particles each has a higher silver concentration than other silver compounds in the inside of the particle, and because a volume shrinkage at bonding is small and the particles generate oxygen to accelerate decomposition of the organic substance.

The precursors of silver oxide are silver carbonate or silver carboxylate, and when the precursors are heated in the presence of the reducing agent, the precursor decomposes to silver oxide, and further silver is reduced to silver particles of a particle size of 100 nm.

The reason of the particle size of the silver oxide or the precursors of the silver oxide is 1 nm to 50 μm is that if the particle size of the silver oxide or the precursor is larger than 50 μm, silver particles become larger than 100 nm during bonding so that gaps among the particle size increase and it is difficult to obtain a dense bonding layer. On the other hand, it is difficult to prepare particles having a particle size less than 1 nm.

Since silver particles having a particle size of 100 nm are formed during bonding, the silver oxide particles or the silver oxide or its precursor should not be required to have a particle size of 100 nm or less. From the view point of preparation of silver oxide precursor, handling and long term storage, the particle size should preferably be 1 nm to 50 μm. On order to obtain a more densely bonding layer, it is preferable to use silver oxide precursor having a particle size of 1 nm to 100 nm.

As silver oxides, there are silver oxide ($Ag_2O$, $AgO$), and bonding material containing the silver oxides may be used. Although the silver oxides ($Ag_2O$, $AgO$) generate oxygen at the time of reducing, there remains no residual and volume shrinkage is very small.

A content of silver oxide or its precursors should preferably be 50 to 99% by weight per the total weight of the bonding material. The larger the content of silver, the smaller the amount of organic residual at low temperature remains so that it is possible to obtain a bonding layer with increased bonding strength, high heat dissipation and high thermal conductivity.

Organic reducing agents are exemplified as alcohols, carboxylic acids, amines and combinations thereof. Alcohols are alkyl alcohols such as ethanol, propanol, butyl alcohol, pentyl alcohol, hexyl alcohol, heptyl alcohol, octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, icocyl alcohol. There are secondary alcohols, tertiary alcohols, alkane diols, cyclic alcohols, beside the primary alcohols.

As carboxylic acids, there are alkyl carboxylic acids such as butanoic acid, netanoic acid, hexanoic acid, heptanoic acid, otanoic acid, nonaoic acid, decanoic acid, undecanoic acid, dodecanoic acid, tridecanoic acid, tetradecanoic acid, pentadecanoic acid, pentadecanoic acid, hexadecanoic acid, heptadecanoic acid, octadecanoic acid, nonadecanoic acid, icosanoic acid. Similarly to the amino groups, there are secondary type carboxylic acids, tertialy type carboxylic acids and dicarboxilic acids and cyclic type carboxylic acids in addition to the primary type carboxylic acids.

There are alkyl amines having an amino group such as butyl amine, pentyl amine, hexyl amine, heptyl amine, octyl amine, nonyl amine, decyl amine, undecyl amine, dodecyl amine, tridecyl amine, tetradecyl amine, pentadecyl amine, hexadecyl amine, heptadecyl amine, octadecyl amine, nonadecyl amine, icodecyl amine. The amine compounds may have branched structures. Examples thereof are 2-ethylhexyl amine, 1, 5-dimethylhexyl amine, etc. In addition to the primary amines, secondary amines, tertialy amines may be used. Cyclic amines may be used.

The reducing agents are not limited to alcohols, carboxylic acids and amines, but organic compounds having aldehyde group, ester group, sulphanyl group, ketone group etc may be used.

When liquid organic agents such as ethylene glycol, triethylene glycol, etc., which are liquid at 20 to 30° C. are employed, silver oxide ($Ag_2O$) mixed with the liquid reducing agent is reduced to silver within one day if the mixture is left. Therefore, the mixture should be used as soon as possible after preparation.

On the other hand, since organic reducing agents, which are solid at 20 to 30° C., such as myristyl alcohol, lauryl amine, ascorbic acid, etc, do not react greatly with silver oxide for about one month, the mixtures are good for storage. If the mixtures are stored for a long time, these compounds are preferred.

Since the reducing agents may work as a protecting film for the silver particles having a particle size of 100 nm or less after the reducing agent reduces silver oxide particles, compound having a desired number of carbon atoms may be preferred. For example, the number of carbon atoms is 2 to 20. If the number of carbon atoms is less than 2, particle growth of silver particles take place simultaneously with forming of silver particles so that formation of metal particles having a particle size of 100 μm or less becomes difficult. If the number of carbon atoms is larger than 20, a decomposition temperature is too high so that sintering of metal particles hardly take place, which leads to a bonding strength.

An additive amount of the organic reducing agents is 1 to 50 parts by weight per the total weight of the precursor of the silver particles. If the amount is less than 1 part by weight, the amount is insufficient for reducing the entire of silver oxide precursor so as to produce silver particles. If the amount is larger than 50 parts by weight, an amount of residual after bonding becomes large so that metallic bonding at the interface and densification of the bonding layer becomes difficult.

In addition, it is preferred that a thermal weight reduction rate of the reducing agents at heating to 400° C. should be 99% or more. If a decomposition temperature of the reducing agents is high, an amount of residue becomes large so that metallic bonding at the interface and densification of the bonding layer becomes difficult. The measurement of the thermal weight reduction rate at heating to 400° C. was carried out at 10° C./min in air atmosphere by means of a thermal mass measurement device, which has been put on the market, such as TG/DTA6200 manufactured by Seiko Instrument and TGA-50 manufactured by Shimadzu Corporation.

Combinations of the silver precursors and the organic reducing agents are not particularly limited as long as the silver particles are formed, but in view of storage, combinations which do not form silver particles at room temperature are preferred.

It is possible to mix metal particles having relatively a large average particle size of 50 to 100 μm as an aggregate. The silver particles having the average particle size of 100 nm or less bond the metal particles having the average particle size of 50 to 100 μm to sinter the metal particles. Further, metal particles having an average particle size may be admixed in advance. As examples of the metal particles, exemplified are gold, silver and copper. Other than the above metals, there is at least one of platinum, palladium, rhodium, osmium, ruthenium, iridium, iron, tin, zinc, cobalt, nickel, chromium, titanium, tantalum, tungsten, indium, silicon, aluminum, etc.

The bonding material can be composed of the metal particle precursor and the organic reducing agent, but when the bonding material is used as a paste, solvents may be mixed. When the mixture is used just after mixing, alcohol type solvents having reducing property can be chosen from methanol, ethanol, propanol, ethylene glycol, triethylene glycol, terpineol, etc. However, if the mixture is stored for a long time, solvents having weak reducing property at room temperature such as water, hexane, tetrahydrofuran, toluene, cyclohexane, etc are preferred. If myristyl alcohol as a reducing agent, which hardly reacts at room temperature, the mixture can be stored for a long time, but if ethylene glycol having a strong reducing property is used, it is mixed at the time of use.

It is possible to add, if desired, a dispersing agent for enhancing dispersibility of the metal particle precursor in the solvent so as to coat the precursor with the organic substance. Examples of the dispersing agents are polyvinyl alcohkl, polyacrylonitrile, polyvinyl pyrroridone, etc. There are polymeric dispersing agents such as DISPERBYK 160, DISPERBYK 161, DISPERBYK 162, DISPERBYK 163, DISPERBYK 166, DISPERBYK 170, DISPERBYK 180, DISPERBYK 182, DISPERBYK 184, DISPERBYK 190 (manufactured by BYK Chemie Japan, Ltd), MegafacF-479 (manufactured by DIC Corporation), Solsperse 20000, Solsperse 24000, Solsperse 26000, Solsperse 27000, Solsperse 28000 (manufactured by Avecia, Ltd.). An additive amount of the dispersing agents is 0.01 to 45% by weight per the weight of the bonding material.

The paste materials are coated by a method of coating connecting portions of electronic parts or electrodes on a substrate by injecting the paste through a minute nozzle in an ink-jet method, a method of coating only necessary portions through a metal mask or a mesh mask, a method of coating only the necessary portions using a dispenser, or a method of coating only the necessary portions using metal mask or a mesh mask and a resin containing silicon or fluorine. Further, there are a method of coating openings formed by coating a water repellent resin with photosensitivity on a substrate or electronic parts, followed by exposure and development to remove the resin from portions to be coated with the paste, and the paste is coated on the openings, and a method of coating openings formed by coating a water repellent resin on a substrate or on electronic parts, followed by removing the resin with laser, and the openings are coated with the paste. These coating methods can be combined in accordance with areas of electrodes and shapes.

When the reducing agents being solid at room temperature such as myristyl alcohol or ascorbic acid are used, the metal particle precursor and the reducing agents are mixed and the mixture is rolled under pressure to form a sheet form bonding material.

In the bonding technique using the bonding material, it is essential to apply heat and pressure to make metal particles having a particle size of 100 nm or less from the silver oxide particle precursor, and to carry out metallic bonding by fusion of the metal particles, exhausting the organic reducing agent from the bonding layer. Preferable bonding conditions are heating for 1 second to 10 minutes at 50 to 400° C. and a pressure of 0.01 to 10 MPa.

In the bonding method of the present invention, the silver oxide particles may be changed to ultra fine pure metal particles, which is not silver oxide, having a particle size of 0.1 to 50 nm, and the ultra fine metal particles turn a bulk by mutual bonding. A melting point of the bulk is the same as that of bulk material. Therefore, the pure metal ultra fine particles fuse and bond at low temperature, but after the fusion, the bulk does not re-melt until a temperature arrives at the melting point. This is an advantage of the present invention that the bonding using ultra fine silver particles can be carried out at low temperatures and after the bonding, the bonding portions do not re-melt during other electronic parts are bonded, because the melting point of the bonding portions becomes high.

The thermal conductivity of the bonding portions after bonding becomes 50 to 430 W/mK so that good heat dissipation property is expected. Further, since the precursor is silver oxide, the bonding material is low cost. It is preferable to coat the silver oxide particle with an organic substance such as alcohol so as to enhance reducing property. Atmosphere for bonding is an oxidative atmosphere, particularly air atmosphere.

There is a Si group oxide layer in the interface between the bonding layer and the Si group semiconductor element bonded to the bonding layer. It is possible to secure high reliability of the bonding layer by bonding the semiconductor element made of Si or Si group material having no metallized layer to an electrode plate with the bonding material having been explained. The metallized layer or metal member formed on the substrate to be bonded to the semiconductor element made of Si or Si group material may not be any metal such as gold, silver, nickel copper, etc, as long as the metal can be metal bonded with the silver bonding material.

In the following, the embodiments of the present invention will be explained by reference to drawings, but the present invention is not limited to the following embodiments.

(Embodiment)

FIG. 1 shows an example of a semiconductor package according to an embodiment of the present invention. A semiconductor element 11 is provided with a plurality of electrode pads 12 on its functioning face, and a protecting film 13 is formed on areas other than the electrode pads 12. The electrode pads 12 are made of aluminum or aluminum alloy. The electrode pads 12 and connecting wire portions 16 on the semiconductor mounting substrate 15 for connecting the electrode pads 12 are connected with gold wire 17. The rear face (opposite face to the functioning face) of the semiconductor element 11 is bonded to the portion of the semiconductor mounting substrate 15 where metal member is formed with the silver bonding material 18. The silver bonding material 18 is composed of silver oxide as the precursor and myristyl alcohol in an amount of 10% by weight. The rear face (opposite face to the main face) of the semiconductor element 11 has no metallized film, but an oxide film 19 is formed. The semiconductor mounting face of the substrate 15 has a metallized film 20.

In the following, a method of manufacturing the semiconductor device of the embodiment will be explained.

According to a conventional method, a semiconductor element having an aluminum wiring pattern was prepared. On the other hand, a substrate for mounting a semiconductor element was prepared wherein the substrate has electrodes for electrical connection with electrode pads of the wiring pattern of the semiconductor element. The substrates 15, 120 constituting a substrate for mounting the semiconductor element are made of silicon nitride, aluminum nitride, alumina, etc.

Figure 2:
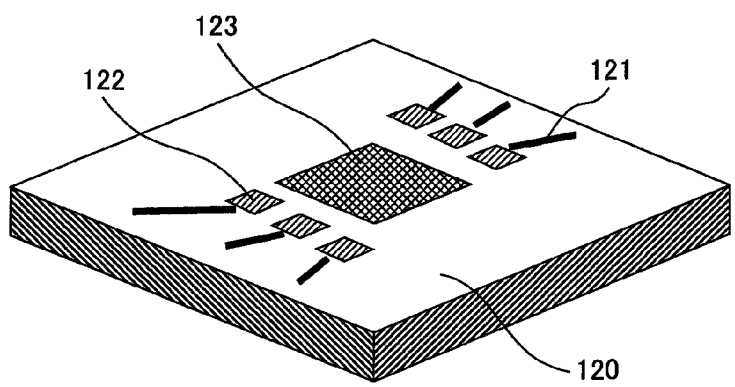
FIG. 2 is a perspective view of a main part shown in FIG. 1.

FIG. 2 shows a perspective view of a semiconductor element mounting substrate. Numeral 120 denotes the semiconductor element mounting substrate, 121 a wiring formed on the main surface of the substrate, 122 electrodes for electrical connection with the electrode pads of the semiconductor element, 123 an area for mounting the semiconductor element. A metal member made of silver plating on aluminum is formed in the area.

At first, the semiconductor element 11 was mounted on the semiconductor mounting area 123 via the silver bonding layer 18 consisting of silver oxide particles and 10% myristyl alcohol. A mounting method comprises coating a paste consisting of silver oxide particles, organic reducing agent and organic solvent on the semiconductor element mounting area 123, placing the semiconductor element, and fixing the semiconductor element on the semiconductor element mounting substrate 15 by heating the semiconductor element at 200° C. in air under a pressure of 1.0 MPa.

Next, the electrode pads 12 and electrodes 16, 122 on the semiconductor element mounting substrate were connected by means of gold wire 17. The main surface of the semiconductor element 11 was covered with a protecting resin 13. Although the semiconductor element mounting substrate is a multilayered wiring board, the semiconductor element mounting substrate may be a lead frame made of iron-nickel alloy or copper alloy, or film made of organic material such as polyimide.

As explained above, since the Si semiconductor element having no metallized film can be mounted in the same manner as the conventional method, production yield is high and cost may be reduced.

Figure 3:
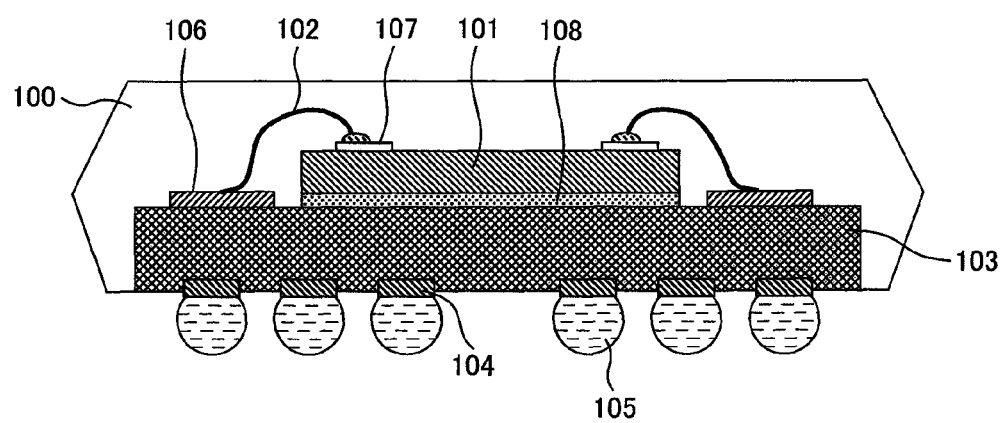
FIG. 3 is an enlarged view of the semiconductor element mounting portion of the semiconductor device according to an embodiment of the present invention.

FIG. 3 shows a semiconductor package called a ball grid array in another embodiment of the present invention. Numeral 100 denotes encapsulating resin, 101 a semiconductor element, 102 bonding wire, 103 a wiring substrate, 104 an electrode, and 105 solder ball. As shown in FIG. 3, the rear face of the semiconductor element 101 is bonded to the wiring substrate 103 via silver bonding material 108. The face of the semiconductor element (rear face) to be mounted on the wiring substrate 103 has Si oxide film, but it has no metallized film.

The wiring substrate 103 is composed of a core portion, its main face and rear face. Electrodes pads 106 are formed on the main face and surface other than the electrode pads 106 is covered with an insulating film (protecting film, not shown). Electrode pads 104 are formed on the rear face, and bumps 105 made of solder are formed on the electrode pads 104. An area other than the electrode pads 104 is covered with an insulating resin film (protecting film, not shown).

The core portion comprises a plurality of resin boards each having wiring made of copper, etc in its face, wherein the bums 104 and electrode pads 106 are connected via wiring each layer or via-holes (connecting portions).

Resin boards constituting the core portion are high elastic modulus resin substrates made of glass fiber and epoxy resin impregnated in the glass fiber, for example. The boards or the wiring boards having the above boards are called glass-epoxy substrate.

The protecting films on the main face and the rear face of the wiring substrate 103 are formed from two-liquid type alkaline development solder resist ink or thermo-setting one liquid type solder resist ink, etc. The electrode pads 106 and 104 are exposed portions of wiring made of copper, for example.

The wiring substrate 103 has a square form of 13 mm×13 mm, and the electrode pads 106 are arranged in two rows. The electrode pads 106 in two rows are arranged in zigzag. The bumps 105 (electrode pads 104) are arranged in area, for example, on the rear face of the wiring substrate 103.

The wiring substrate 103 works as a interposer in mounting the semiconductor element 101 on a mother board.

The semiconductor element 101 is fixed on the wiring substrate 103 via the silver bonding layer 108. A metal member (metallized layer) is formed on an area for mounting the semiconductor element. The silver bonding layer 108 is made from a silver bonding material consisting of silver oxide particles and butyl alcohol as a reducing agent in an amount of 5% by weight. The semiconductor element 101 was placed via the silver bonding material 108 on the area of the wiring substrate 103 for mounting the semiconductor element. A method of mounting forming the paste of silver oxide precursor bonding material on the semiconductor element mounting area by a printing method, placing the semiconductor element, and heating at about 180° C. in air under a pressure of 1.0 MPa to fix the semiconductor element to the wiring substrate 103.

The semiconductor element 101 comprises a semiconductor formed on a substrate, an insulating film and wiring, etc and its surface (element formed face) has electrode pads (bonding pads or simply pads) 107. The electrode pads 107 are exposed portions of the uppermost layer of wiring (metal film) made of aluminum, for example. A thickness of the uppermost layer of the wiring is 2000 nm, for example. A portion other than the electrode pads 107 is covered with an insulating film made of inorganic film such as a laminated film of silicon oxide and silicon nitride or organic film such as polyimide. As the uppermost wiring layer, aluminum was used.

The semiconductor element 101 has a square shape of 5 mm×5 mm, and the electrode pads are arranged along each side of the element. The electrode pads 106 of the wiring substrate 103 and the electrode pads 107 of the semiconductor element are electrically connected by means of a good conductor such as gold.

Figure 4:
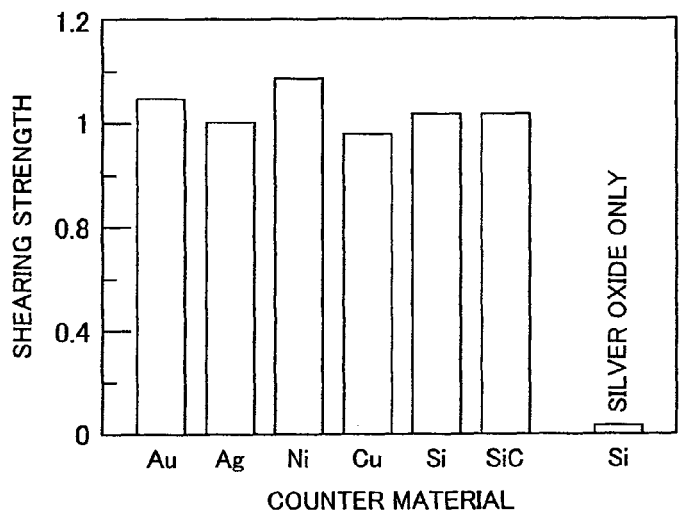
FIG. 4 shows bonding property at the bonding portion according to the present invention.

FIG. 4 shows evaluation results of bonding strength of bonded portions. A bonding temperature was 200° C. and a pressure was 1.0 MPa constant. The bonding material comprised silver oxide particles having an average particle size of 2 μm containing myristyl alcohol in an amount of 5% by weight. Bonding between Au, Ag, Ni or Cu and Si or SiC was conducted. The horizontal axis represents a shearing strength in normalized value with respect to Ag. For comparison, evaluation of silver oxide is shown.

As a result, bonding strengths with respect to Si, SiC were strong enough, which were almost the same as those with respect to Au, Ag, Ni, Cu. However, if the bonding material is silver oxide only, bonding was not possible. From the evaluation results, it has been elucidated that bonding to Si or Sic is not accomplished without reducing effect by myristyl alcohol.

FIG. 5 shows a cross sectional view of the bonded portion shown in FIG. 1, which shows the bonding state of the cross section of Si or SiC. According to the method of this embodiment, metals are excellently bonded to Si or SiC. A thickness of the oxide film in the interface was about 0.1 to 100 nm.

Next, an example of preferred semiconductor device according to embodiment of the present invention will be explained. The bonded portion shown in FIG. 1 is a heat dissipating portion. Therefore, copper oxide is a useful material for the particle layer in addition to silver oxide. The copper oxide and silver oxide may be mixed. These materials make it possible to bond the counter electrodes with formed nanometer size particles by the action of the reducing effect at heating (reducing action with organic substance such as alcohol and reducing atmosphere) at a bonding temperature of 200° C.

What is claimed is:

1. A semiconductor device comprising a substrate having a metal face on a side for mounting a semiconductor element made of Si or SiC, wherein the semiconductor element has a circuit on its main face and the rear face is bonded to the substrate via a sintered silver bonding layer made from fine particles and an oxide layer whose main ingredient is $SiO_2$, the $SiO_2$ layer being formed between the rear face of the semiconductor element and the sintered silver bonding layer, wherein the sintered silver bonding layer consists of sintered silver metal in which the crystal grains of the silver metal are closely contacting each other, wherein the sintered silver bonding layer and the $SiO_2$ layer, and the sintered silver bonding layer and the metal face of the substrate are, respectively, in closely contact with each other, wherein the $SiO_2$ layer is an activated oxide layer, and wherein the sintered silver bonding layer is bonded to the activated oxide layer.

2. The semiconductor device according to claim 1, wherein a thickness of the oxide layer is 0.1 nm to 100 nm.

3. The semiconductor device according to claim 1, wherein a thickness of the silver bonding layer is 10 nm to 500 μm.

4. The semiconductor device according to claim 1, wherein the silver bonding layer is constituted by partially fused and bonded silver particles.

5. The semiconductor device according to claim 1, wherein a porosity of the silver bonding layer is 30% or less.

6. The semiconductor device according to claim 1, wherein the purity of the metal of the silver bonding layer is 99% or more.

7. The semiconductor device according to claim 1, wherein the particle size of silver metal in the silver bonding layer is 10 nm to 50 nm.

8. The semiconductor device according to claim 1, wherein the thermal conductivity of the silver bonding layer is 50 to 430 W/mK.

9. The semiconductor device according to claim 1, wherein a thickness of the $SiO_2$ layer on the rear face of the semiconductor element is 0.1 nm to 100 nm.

10. The semiconductor device according to claim 1, wherein the activated oxide layer is a product of a reducing reaction of the $SiO_2$ layer.

11. The semiconductor device according to claim 1, wherein the silver bonding layer is made of fine particles having a particle size of 1 nm to 50 nm.

12. A method of manufacturing a semiconductor device comprising:
holding a bonding material containing silver oxide or silver carbonate or silver carboxylate particles and an organic reducing agent between a rear face of a semiconductor element having a circuit in a main face and a substrate;
bonding the Si group semiconductor element to a substrate via a Si oxide flayer formed on the rear face of the Si group semiconductor element by heating at least the bonding material in oxidative atmosphere to thereby effect reducing reaction of the oxide particles to metallize the silver oxide particles and sinter the silver particles, resulting in a bonding layer of sintered body of silver metal.

13. The method of manufacturing a semiconductor device according to claim 12, wherein the metal face formed on the substrate is metallized layer.

14. The method of manufacturing a semiconductor device according to claim 12, wherein an average particle size of the silver oxide particles is 1 to 50 nm.

15. The method of manufacturing a semiconductor device according to claim 12, wherein the reducing agent is at least one selected from the group consisting of alcohols, carboxylic acids and amines.

16. The method of manufacturing a semiconductor device according to claim 12, wherein the bonding material is composed of silver oxide particles or its precursor dispersed in an organic solvent.

17. The method of manufacturing a semiconductor device according to claim 12, wherein an amount of the reducing agent is 1 to 50 parts by weight per 100 parts by weight of the silver oxide particles.

18. The method of manufacturing a semiconductor device according to claim 12, wherein the bonding material is a paste comprising silver oxide or its precursor, an organic reducing agent and an organic solvent.

19. The method of manufacturing a semiconductor device according to claim 12, wherein the heating of the bonding material is carried out in air.

* * * * *